(12) United States Patent
Jimbo et al.

(10) Patent No.: US 12,148,181 B2
(45) Date of Patent: Nov. 19, 2024

(54) MEASUREMENT APPARATUS THAT MEASURES POSITION INFORMATION OF MEASUREMENT TARGET IN PREDETERMINED DIRECTION

(71) Applicant: CANON KABUSHIKI KAISHA, Tokyo (JP)

(72) Inventors: Satoru Jimbo, Tochigi (JP); Noburu Takakura, Tochigi (JP); Shinichiro Koga, Tochigi (JP); Yusuke Miura, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 477 days.

(21) Appl. No.: 17/411,176

(22) Filed: Aug. 25, 2021

(65) Prior Publication Data

US 2022/0067958 A1  Mar. 3, 2022

(30) Foreign Application Priority Data

Aug. 28, 2020 (JP) ................. 2020-144875
Jul. 30, 2021 (JP) ................. 2021-126044

(51) Int. Cl.
*G06T 7/73* (2017.01)
*G01B 11/00* (2006.01)
(Continued)

(52) U.S. Cl.
CPC .............. *G06T 7/73* (2017.01); *G01B 11/002* (2013.01); *G01B 11/272* (2013.01);
(Continued)

(58) Field of Classification Search
CPC ..................... G06T 7/73; G06T 7/0004; G06T 2207/20056; G06T 2207/20081;
(Continued)

(56) References Cited

U.S. PATENT DOCUMENTS

| 6,342,703 B1 * | 1/2002 | Koga ................... G03F 9/7092 |
| | | 250/548 |
| 7,493,185 B2 | 2/2009 | Cheng |

(Continued)

FOREIGN PATENT DOCUMENTS

| JP | 2005197483 | * | 7/2005 | .......... H01L 21/027 |
| JP | 2006147989 | * | 6/2006 | .......... H01L 21/027 |

(Continued)

*Primary Examiner* — Alexander Satanovsky
(74) *Attorney, Agent, or Firm* — ROSSI, KIMMS & McDOWELL LLP

(57) ABSTRACT

A measurement apparatus measures position information of a measurement target in a first direction. The apparatus comprises a scope configured to capture an image of the measurement target and generate image data, and a processor configured to obtain, based on the image data, the position information of the measurement target in the first direction. The processor is configured to determines the position information of the measurement target in the first direction based on: provisional position information of the measurement target in the first direction obtained from the image data, and using a correction value which is output from a model by inputting, in the model, a feature quantity, of the image data, related to a second direction different from the first direction.

25 Claims, 14 Drawing Sheets

(51) Int. Cl.
  *G01B 11/27*  (2006.01)
  *G03F 7/00*  (2006.01)
  *G06T 7/00*  (2017.01)
(52) U.S. Cl.
  CPC .......... *G03F 7/0002* (2013.01); *G06T 7/0004* (2013.01); *G06T 2207/20056* (2013.01); *G06T 2207/20081* (2013.01); *G06T 2207/30204* (2013.01)
(58) Field of Classification Search
  CPC . G06T 2207/30204; G06T 2207/20068; G06T 2207/30141; G06T 2207/30148; G01B 11/002; G01B 11/272; G03F 7/0002; G03F 9/7042
  See application file for complete search history.

(56) References Cited

U.S. PATENT DOCUMENTS

2006/0092420 A1* 5/2006 Oishi .................... G03F 9/7092
  356/401
2016/0098837 A1* 4/2016 Saiki ......................... G06T 7/73
  348/87

FOREIGN PATENT DOCUMENTS

JP          2007250578 A    9/2007
JP           4601492  B2   12/2010

* cited by examiner

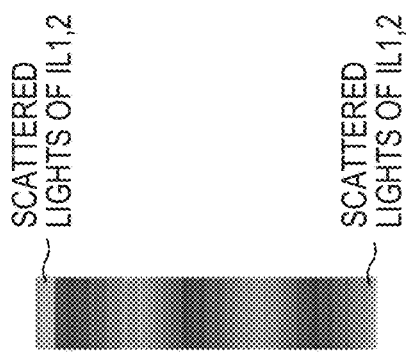
FIG. 14A
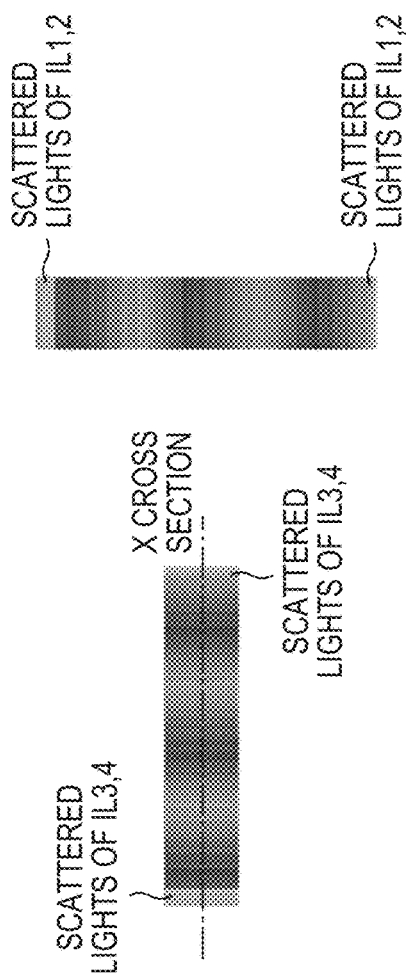
FIG. 14B
FIG. 14C
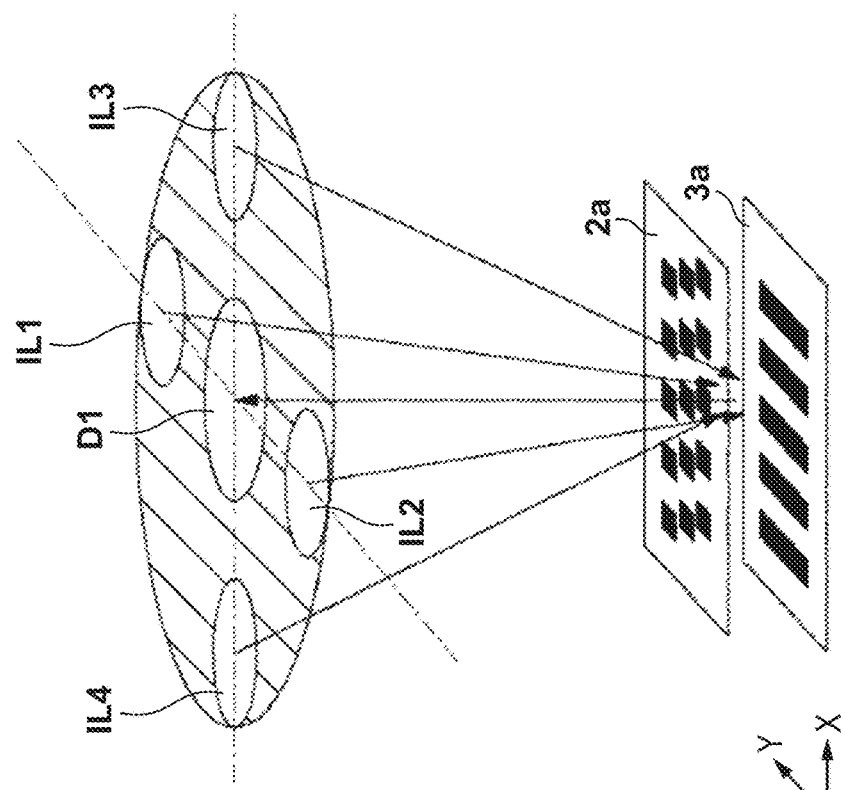
FIG. 14D

MEASUREMENT APPARATUS THAT MEASURES POSITION INFORMATION OF MEASUREMENT TARGET IN PREDETERMINED DIRECTION

BACKGROUND OF THE INVENTION

Field of the Invention

The present invention relates to a measurement apparatus, a measurement method, a lithography apparatus, a method of manufacturing an article, and a model.

Description of the Related Art

In a lithography process for manufacturing an article such as a semiconductor device or the like, a lithography apparatus such as an imprint apparatus, an exposure apparatus, or the like can be used. A lithography apparatus can transfer a pattern of an original to a shot region of a substrate. An imprint apparatus brings a mold into contact with an imprint material arranged on a shot region of a substrate and cures the imprint material to form a pattern made of a cured product of the imprint material on the shot region. An exposure apparatus can project a pattern of an original to a shot region of a substrate coated with a photosensitive material to form a latent pattern of the original on the photosensitive material. The latent image is converted into a physical pattern by a development process. To accurately align the shot region of a substrate and an original, such lithography apparatuses require a technique for accurately measuring a relative position between a mark on the substrate and a mark on the original.

SUMMARY OF THE INVENTION

The present invention provides a technique advantageous in accurately measuring position information of a measurement target.

One of aspects of the present invention provides a measurement apparatus that measures position information of a measurement target in a first direction, comprising: a scope configured to capture an image of the measurement target and generate image data; and a processor configured to obtain, based on the image data, the position information of the measurement target in the first direction, wherein the processor is configured to determine the position information of the measurement target in the first direction based on: provisional position information of the measurement target in the first direction obtained from the image data, and a correction value which is output from a model by inputting, in the model, a feature quantity of the image data, related to a second direction different from the first direction.

Further features of the present invention will become apparent from the following description of exemplary embodiments with reference to the attached drawings.

BRIEF DESCRIPTION OF THE DRAWINGS

FIGS. 14A to 14D are views for explaining a moiré measurement system;

DESCRIPTION OF THE EMBODIMENTS

Figure 1:
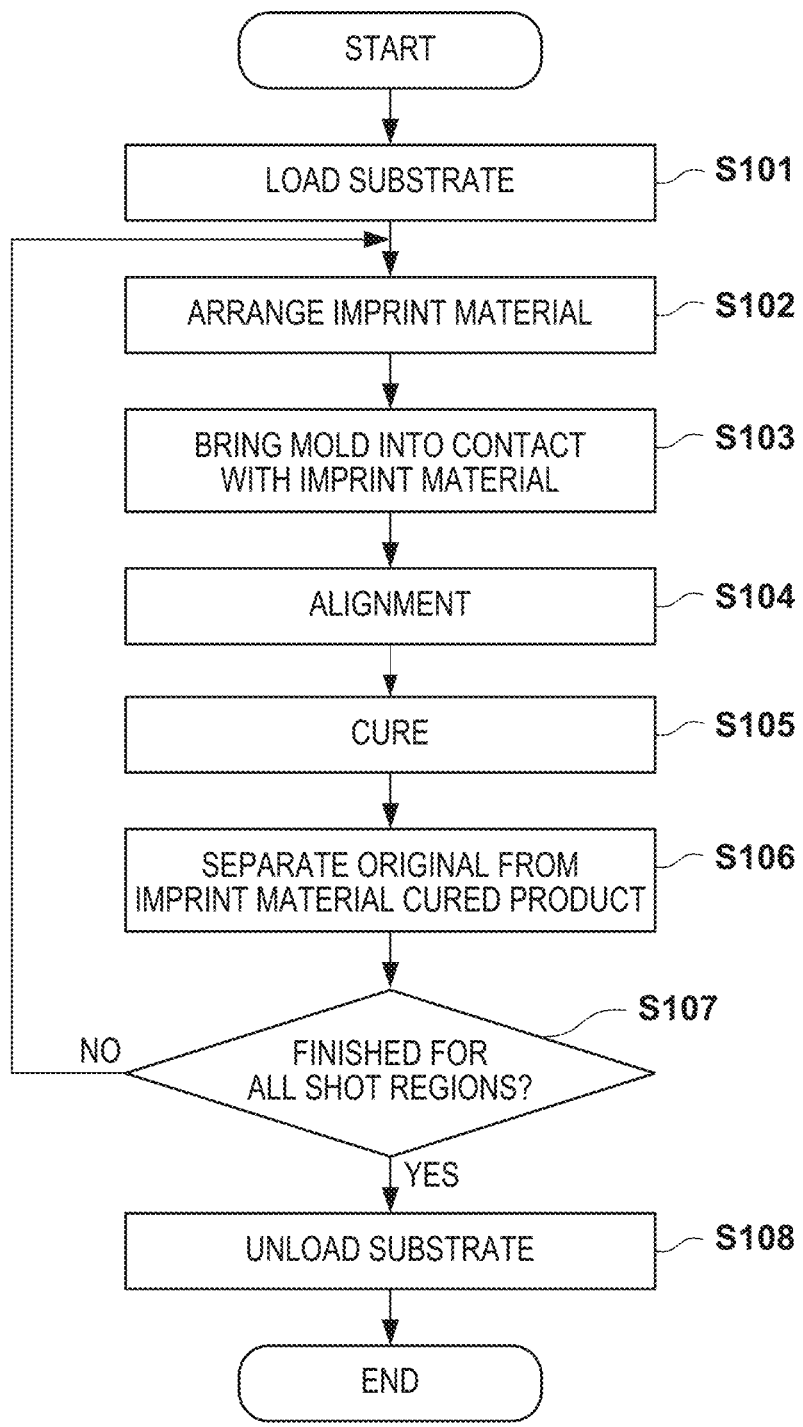
FIG. 1 is a flowchart showing an example of an operation of an imprint apparatus.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Although an imprint apparatus will be described as an example of a lithography apparatus hereinafter, there are many commonalities between an imprint apparatus and an exposure apparatus in regards to a technique for aligning an original and a shot region of a substrate. Hence, an alignment technique to be described below can also be applied to an exposure apparatus.

Figure 2A:
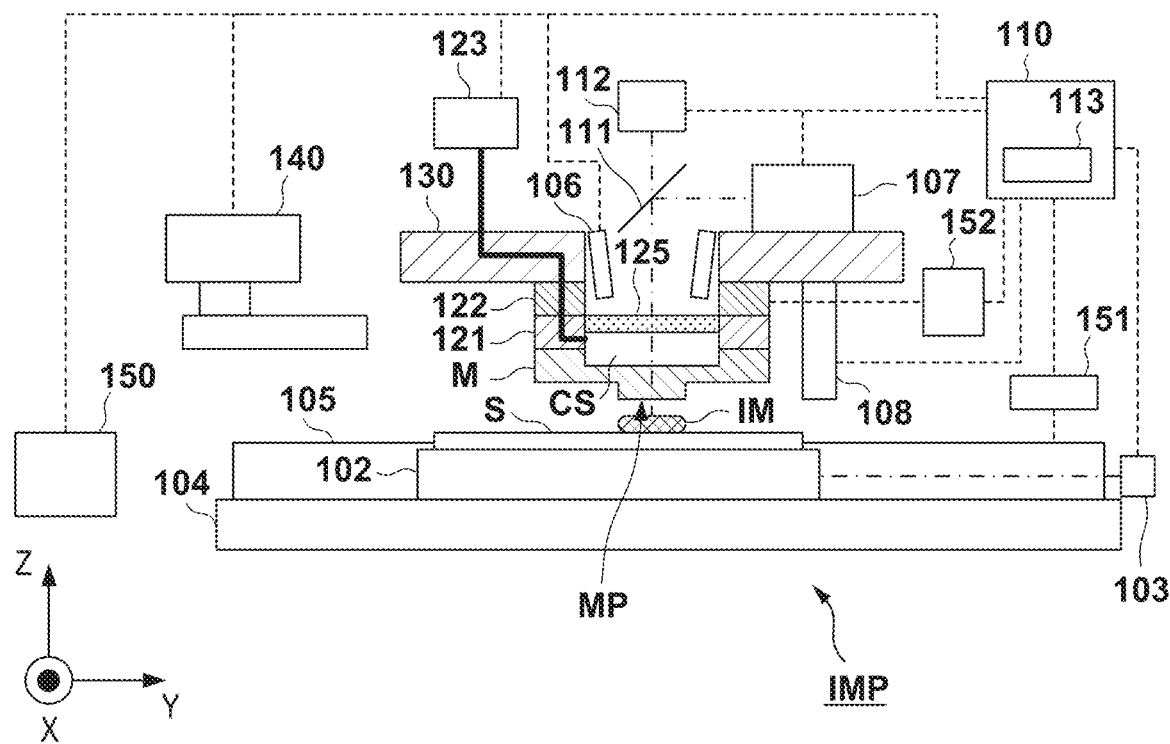
FIGS. 2A and 2B are views each showing an example of the arrangement and the operation of the imprint apparatus.

FIG. 2A schematically shows the arrangement of an imprint apparatus IMP according to an embodiment. The imprint apparatus IMP performs an imprint process in which an imprint material IM is cured in a state in which the imprint material IM on a shot region of a substrate S and a pattern region MP of a mold M are in contact with each other, and a cured product of the imprint material IM and the mold M are subsequently separated from each other. A pattern is formed on the shot region of the substrate S by this imprint process.

As the imprint material, a curable composition (to be also referred to a resin in an uncured state) to be cured by receiving curing energy is used. As the curing energy, an electromagnetic wave or heat can be used. The electromagnetic wave can be, for example, light selected from the wavelength range of 10 nm or more to 1 mm or less, for example, infrared light, a visible light beam, or ultraviolet light. The curable composition can be a composition cured by light irradiation or heating. Among compositions, a photo-curable composition cured by light irradiation contains at least a polymerizable compound and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The imprint material can be arranged on the substrate in the form of droplets or in the form of an island or film formed by connecting a plurality of droplets. The viscosity (the viscosity at 25° C.) of the imprint material can be, for example, 1 mPa·s or more to 100 mPa·s or less. As the material of the substrate, for example, glass, a ceramic, a metal, a semiconductor, a resin, or the like can be used. A member made of a material different from the substrate may be provided on the surface of the substrate, as needed. The substrate is, for example, a silicon wafer, a compound semiconductor wafer, or silica glass.

In the specification and the accompanying drawings, directions will be indicated on an XYZ coordinate system in which directions parallel to the surface of the substrate S are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z-axes, and an orientation is information that can be specified by values on the θX-, θY-, and θZ-axes. Positioning means controlling the position and/or orientation. Alignment can include controlling the position and/or orientation of at least one of the substrate and the mold.

The imprint apparatus IMP can include a substrate holder 102 that holds the substrate S, a substrate driving mechanism 105 that drives the substrate S by driving the substrate holder 102, a base 104 that supports the substrate holder 102, and a position measuring device 103 that measures the position of the substrate holder 102. The substrate driving mechanism 105 can include, for example, a motor such as a linear motor or the like. The imprint apparatus IMP can include a sensor 151 that measures a substrate driving force (alignment load) necessary for the substrate driving mechanism 105 to drive the substrate S (substrate holder 102) during alignment. The substrate driving force required in an alignment operation, which is performed in a state in which the imprint material IM on the substrate S and the pattern region MP of the mold M are in contact with each other, corresponds to a shearing force that acts between the substrate S and the mold M. The shearing force is mainly a force that acts on the substrate S and the mold M in a plane direction. The substrate driving force required during alignment is, for example, correlated to the magnitude of a current supplied to the motor of the substrate driving mechanism 105 during alignment, and the sensor 151 can measure the substrate driving force based on the magnitude of the current. The sensor 151 is an example of a sensor for measuring the influence (shearing force) received by the mold M during pattern formation. In addition, a driving request (command value) output from a controller 110 (to be described later) to the substrate driving mechanism 105 will be referred to as a stage control value.

The imprint apparatus IMP can include a mold holder 121 that holds the mold M which serves as an original, a mold driving mechanism 122 that drives the mold M by driving the mold holder 121, and a support structure 130 that supports the mold driving mechanism 122. The mold driving mechanism 122 can include, for example, a motor such as a voice coil motor or the like. The imprint apparatus IMP can include a sensor 152 that measures a mold releasing force (separation load) and/or a pressing force. A mold releasing force is a force necessary for separating the cured product of the imprint material IM on the substrate S and the mold M from each other. A pressing force is a force for pressing the mold M to make the mold M contact the imprint material IM on the substrate S. The mold releasing force and the pressing force are forces that mainly act on a direction perpendicular to a plane direction of the substrate S and the mold M. The mold releasing force and the pressing force are, for example, correlated to the magnitude of a current supplied to the motor of the mold driving mechanism 122, and the sensor 152 can measure the mold releasing force and the pressing force based on the magnitude of the current. The sensor 152 is an example of a sensor for measuring the influence(s) (the mold releasing force and/or the pressing force) received by the mold M during the pattern formation. In addition, a driving request (command value) output from the controller 110 (to be described later) to the mold driving mechanism 122 will also be referred to as a stage control value.

The substrate driving mechanism 105 and the mold driving mechanism 122 form a driving mechanism for adjusting a relative position and a relative posture between the substrate S and the mold M. The adjustment of the relative position between the substrate S and the mold M includes a driving operation to bring the mold into contact with the imprint material on the substrate S and a driving operation to separate the mold from the cured imprint material (a pattern made of the cured product). The substrate driving mechanism 105 can be configured to drive the substrate S about a plurality of axes (for example, three axes including the X-axis, Y-axis, and θZ-axis, and preferably six axes including the X-axis, Y-axis, Z-axis, θX-axis, θY-axis, and θZ-axis). The mold driving mechanism 122 can be configured to drive the mold M about a plurality of axes (for example, three axes including the Z-axis, θX-axis, and θY-axis, and preferably six axes including the X-axis, Y-axis, Z-axis, θX-axis, θY-axis, and θZ-axis).

The imprint apparatus IMP can include a mold cleaner 150 and a mold conveyance mechanism 140 for conveying the mold M. The mold conveyance mechanism 140 can be configured, for example, to convey the mold M to the mold holder 121 and to convey the mold M from the mold holder 121 to an original stocker (not shown) or the mold cleaner 150. The mold cleaner 150 will clean the mold M by using ultraviolet light, a chemical solution, and the like.

Figure 2B:
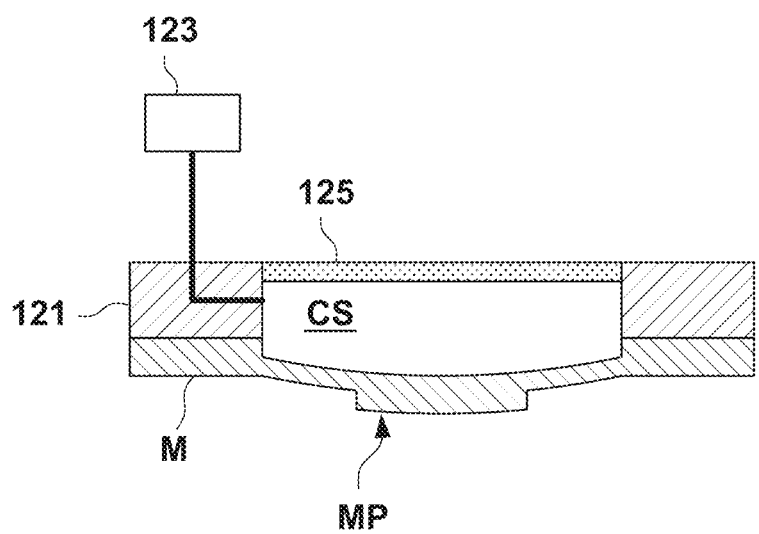

The mold holder 121 can include a window member 125 that forms a pressure controlled space CS on the side of a reverse surface (a surface on a side opposite to the pattern region MP on which the pattern to be transferred to the substrate S is formed) of the mold M. The imprint apparatus IMP can include a deforming mechanism 123 that controls the pressure (to be referred to as a cavity pressure hereinafter) of the pressure controlled space CS to deform the pattern region MP of the mold M into a convex shape toward the substrate S as schematically shown in FIG. 2B. In addition, the imprint apparatus IMP can include an alignment scope (alignment measuring device) 106, a curing device 107, an image capturing device 112, and an optical member 111.

The alignment scope 106 can illuminate a first mark of the substrate S (first member) and a second mark of the mold M (second member) and generate image data by capturing an image of moiré fringes (measurement target) as an optical image formed by the first mark and the second mark. Note that each mark used for alignment can be called an alignment mark. The alignment scope 106 or the controller 110 can detect relative position information between the first mark and the second mark by processing the image data generated by image capturing. The relative position information between the first mark and the second mark may also be measured here without forming the moiré fringes by using the first mark and the second mark. For example, a box-in-box mark can be formed by the first mark and the second mark. The alignment scope 106 can be positioned by a driving mechanism (not shown) in accordance with the position of the alignment mark to be observed. The position information of each first alignment mark and/or the position information of each second mark may also be individually detected by using the alignment scope 106. Image data generated by image capturing by the alignment scope 106 will also be referred to as an alignment image hereinafter. In addition, a result of measurement by the alignment scope 106 will also be referred to as an alignment measurement result.

The curing device 107 irradiates the imprint material IM with an energy (for example, light such as ultraviolet light) for curing the imprint material IM via the optical member 111, and cures the imprint material IM with this energy. The image capturing device 112 captures an image of the substrate S, the mold M, and the imprint material IM via the optical member 111 and the window member 125. Image data obtained by image capturing by the image capturing device 112 will also be referred to as a spread image hereinafter.

The imprint apparatus IMP can include a dispenser 108 for arranging the imprint material IM on a shot region of the substrate S. The dispenser 108 discharges the imprint material IM so that the imprint material IM will be arranged on the shot region of the substrate S in accordance with, for example, a drop recipe which indicates the arrangement of the imprint material IM. The imprint apparatus IMP can include the controller 110 for controlling the substrate driving mechanism 105, the mold driving mechanism 122, the deforming mechanism 123, the mold conveyance mechanism 140, the mold cleaner 150, the alignment scope 106, the curing device 107, the image capturing device 112, the dispenser 108, and the like. The controller 110 can be formed by, for example, a PLD (the abbreviation of a Programmable Logic Device) such as an FPGA (the abbreviation of a Field Programmable Gate Array), an ASIC (the abbreviation of an Application Specific Integrated Circuit), a general-purpose computer embedded with a program 113 or a combination of all or some of these components.

Figure 3:
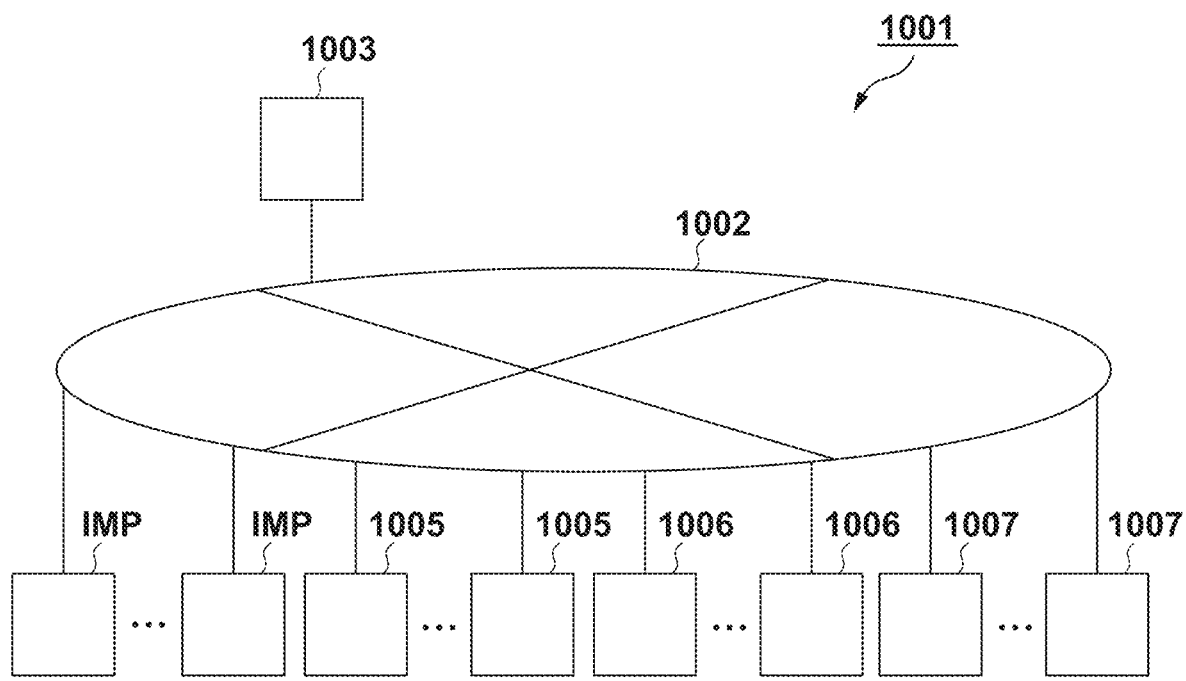
FIG. 3 is a view showing an example of the arrangement of an article manufacturing system.

FIG. 3 shows an example of the arrangement of an article manufacturing system 1001 for manufacturing an article such as a semiconductor device or the like. The article manufacturing system 1001 can include, for example, one or a plurality of lithography apparatuses (the imprint apparatus IMP and/or an exposure apparatus). The article manufacturing system 1001 can also include one or a plurality of inspection apparatuses 1005 (for example, an overlay inspection apparatus and/or a foreign substance inspection apparatus), and one or a plurality of processing apparatuses 1006 (an etching apparatus and/or a deposition apparatus). Furthermore, the article manufacturing system 1001 can include model generation apparatuses (machine learning controllers) 1007 for generating a machine learning model for calculating an alignment error amount. These apparatuses can be connected to a control apparatus 1003, as an external systems, via a network 1002, and be controlled by the control apparatus 1003. An MES, an EEC, or the like is an example of the control apparatus 1003. Each model generation apparatus 1007 can be formed by, for example, a PLD (the abbreviation of a Programmable Logic Device) such as an FPGA (the abbreviation of a Field Programmable Gate Array), an ASIC (the abbreviation of an Application Specific Integrated Circuit), a general-purpose computer embedded with a program or a combination of all or some of these components. Each model generation apparatus 1007 can be, for example, a server called an edge server or the like. The model generation apparatus 1007 may also be incorporated in the control apparatus 1003 or a controller of the imprint apparatus IMP or an exposure apparatus. The system including lithography apparatuses such as the imprint apparatus IMP, the exposure apparatus, and the like and the model generation apparatus 1007 can be understood to be a lithography system.

The alignment scope 106 and the controller (processor) 110 of the imprint apparatus IMP can form a measurement apparatus for measuring or detecting the position information of a measurement target. In another point of view, the imprint apparatus IMP includes a measurement apparatus for measuring or detecting the position information of a measurement target. The measurement apparatus can operate as a measurement apparatus that measures or detects the position information of a measurement target in a diffraction direction of a diffracting grating forming each alignment mark, that is, a first direction as a measurement direction. Furthermore, the measurement apparatus can be formed to measure the position information of the measurement target in a direction different from the first direction as the measurement direction, that is, a second direction (for example, a direction perpendicular to the first direction) as a non-measurement direction. The processor can use provisional position information of the measurement target in the first direction that is obtained from image data, and a correction value that is based on a feature quantity of image data related to the second direction, which is different from the first direction, to determine the position information of the measurement target in the first direction. The second direction can be a direction perpendicular to the first direction. The measurement apparatus can further include a model for obtaining a correction value based on a feature quantity. In addition, the measurement apparatus can further include a machine learning controller that generates the model by machine learning.

A lithography method according to this embodiment will be described hereinafter. This lithography method can include a measurement method for measuring the position information of a measurement target, a measurement method for measuring an alignment error between a shot region of a substrate and an original (mold), and an alignment method for aligning the shot region of the substrate and the original (mold).

This lithography method will estimate, from the image data of an inspection target, a correction value or an alignment error amount as a correction amount. The inspection target here can be (an optical image of) a mark or an optical image (for example, moiré fringes) formed by the first mark and the second mark. An alignment error amount can be an error amount (estimated error amount) of a position (position information) of a mark calculated based on the image data of the inspection target or an error amount (estimated error amount) of relative position (relative position information) between the first mark and the second mark.

First Embodiment

FIG. 1 shows, as an embodiment of a lithography method, a lithography method to be executed in a lithography system including an imprint apparatus IMP. A controller 110 can control the operation shown in FIG. 1. In step S101, a substrate conveyance mechanism (not shown) will convey a substrate S from a conveyance source (for example, a relay portion between a preprocessing apparatus and the imprint apparatus IMP) to a substrate holder 102.

In steps S102 to S106, an imprint process (pattern formation) is executed on a shot region selected from a plurality of shot regions of the substrate S. First, in step S102, a dispenser 108 arranges an imprint material IM on the shot region selected from the plurality of shot regions of the substrate S. This process can be performed by, for example, causing the dispenser 108 to discharge the imprint material IM while driving the substrate S by a substrate driving mechanism 105. In step S103, the substrate S and a mold M are driven relatively by at least one of the substrate driving mechanism 105 and a mold driving mechanism 122 so that a pattern region MP of the mold M will contact the imprint material IM on the shot region. In one example, the mold driving mechanism 122 will drive the mold M so that the pattern region MP of the mold M will contact the imprint material IM on the shot region. In the process of bringing the pattern region MP of the mold M into contact with the imprint material IM, a deforming mechanism 123 can deform the pattern region MP of the mold M into a convex shape toward the substrate S. At this time, a cavity pressure can be controlled and its value can be accumulated. In addition, an image capturing device 112 will execute image capturing in the process of bringing the pattern region MP of the mold M into contact with the imprint material IM, and a captured image (spread image) can be accumulated.

In step S104, the shot region of the substrate S and the pattern region MP of the mold M can be aligned. The alignment can be performed by using an alignment scope 106 to measure a relative position between the first mark of the shot region and the second mark of the mold M so that the relative position will fall within a tolerance range of a target relative position. In the alignment, the substrate S and the mold M can be driven relatively by at least one of the substrate driving mechanism 105 and the mold driving mechanism 122. Here, a target value of a relative driving amount of the substrate S and the mold M can be obtained by correcting provisional position information (provisional relative-position information) based on an alignment error amount (correction value). The provisional position information (provisional relative-position information) is information determined based on image data obtained by using the alignment scope 106, and can indicate the provisional relative position between the shot region of the substrate S and the mold M. The alignment error amount can be calculated based on the image data obtained by using the alignment scope 106. The alignment error amount can be calculated by using a model generated by a model generation apparatus 1007 and provided to the controller 110 of the imprint apparatus IMP. The correction of the position information (provisional relative-position information) based on the alignment error amount (correction value) may be executed throughout the entire execution period of the alignment or may be executed at or after a point of time when the relative position between the shot region and the mold M has become equal to or less than a reference value. The controller 110 can accumulate the image data obtained by using the alignment scope 106 and provide the accumulated image data to the model generation apparatus 1007. The model generation apparatus 1007 can generate, based on the image data provided from the controller 110 of the imprint apparatus IMP in this manner, a model for determining the alignment error amount.

Figure 6A:
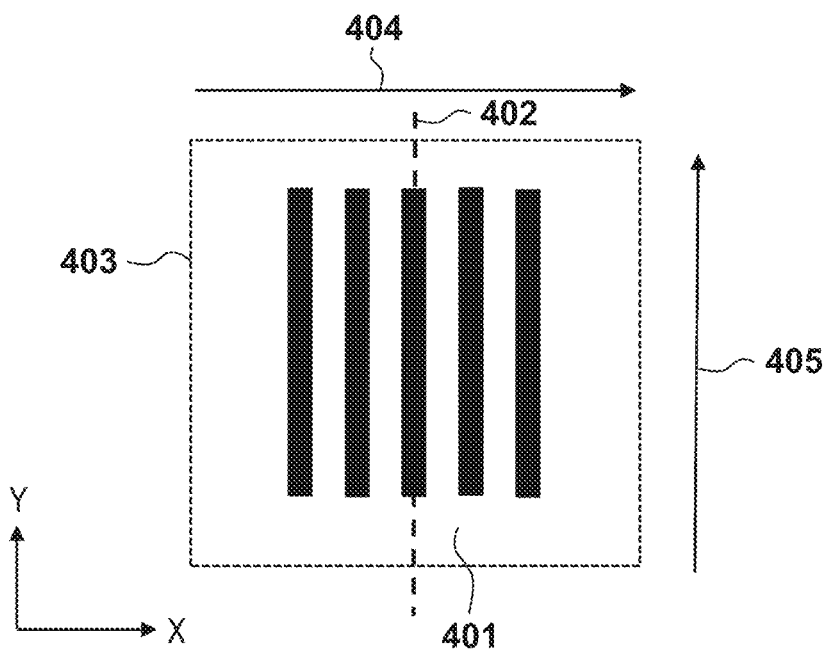
FIGS. 6A and 6B are views showing image data and an alignment waveform, respectively, of an alignment mark.
Figure 6B:
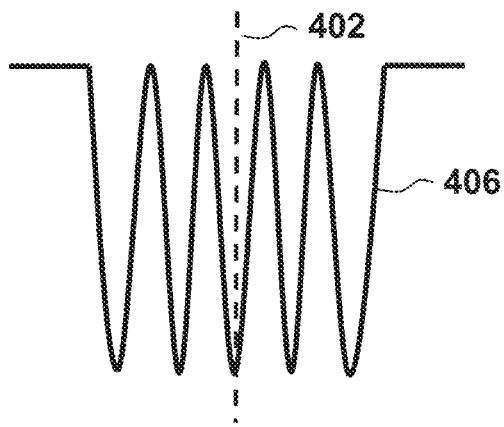

A method for measuring the position of a mark will be exemplified here. FIG. 6A shows an example of a mark image (image data) 401 obtained by capturing an image of a mark for measuring a position in the X direction, and FIG. 6B shows an example of an alignment waveform 406 obtained from the mark image 401. The substrate S can include a mark corresponding to the mark image of FIG. 6A and a mark obtained by rotating the mark by 90°. The mark corresponding to the mark image of FIG. 6A is used for measuring a position in the X direction, and the measurement direction is the X direction. The mark obtained by rotating the mark corresponding to the mark image of FIG. 6A by 90° is used for measuring a position in the Y direction, and the measurement direction is the Y direction.

A position in the X direction and a position in the Y direction of the shot region can be detected as the provisional position information by using a first mark for measuring the position in the X direction provided on the shot region of the substrate S and a first mark of measuring the position in the Y direction provided on the shot region of the substrate S. In addition, a position in the X direction and a position in the Y direction of the mold M can be detected as the provisional position information by using a second mark for measuring the position in the X direction provided on the mold M and a second mark for measuring the position in the Y direction provided on the mold M. The controller 110 can determine, based on the pieces of provisional position information described above and the aforementioned correction value, an accurate relative position (alignment error) between the shot region of the substrate S and the mold M.

Alternatively, a relative position between the shot region and the mold M in the X direction can be detected as provisional relative-position information from moiré fringes formed by the first mark for measuring a position in the X direction provided on the shot region of the substrate S and the second mark for measuring a position in the X direction provided on the mold M. In a similar manner, a relative position between the shot region and the mold M in the Y direction can be detected as provisional relative-position information from moiré fringes formed by the first mark for measuring a position in the Y direction provided on the shot region of the substrate S and the second mark for measuring a position in the Y direction provided on the mold M. The controller 110 can determine, based on the pieces of provisional position information described above and the aforementioned correction value, an accurate relative position (alignment error) between the shot region of the substrate S and the mold M.

Figure 7:
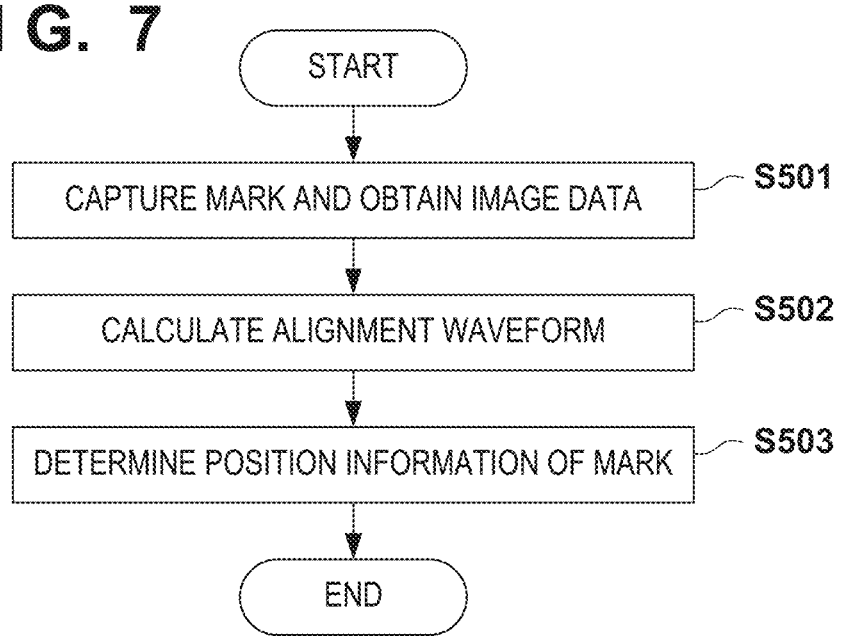
FIG. 7 is a flowchart showing an example of a method for calculating position information (provisional position information) of a mark from the image data of the alignment mark.

FIG. 7 shows a method of measuring the position of a mark by using the alignment scope 106. A method for measuring a mark position 402 will be described hereinafter by using the mark image of FIG. 6A as an example. The mark position 402 to be measured is a center position of the mark image in the measurement direction (the X direction in FIG. 6A), and this is also the center position of the mark corresponding to this mark image. In this example, assume that a measurement direction 404 is the X direction and a non-measurement direction 405 is the Y direction.

In step S501, the controller 110 obtains the mark image 401 (image data) by using the alignment scope 106 to capture an image of the mark. In step S502, the controller 110 generates the alignment waveform 406 based on the mark image 401. The alignment waveform 406 can be generated by calculating an integrated value of pixels whose positions in the measurement direction 404 (X direction) are equal to each other, among a plurality of pixels which form a measurement region 403 including the mark image 401.

In step S503, the controller 110 calculates the mark position 402 based on the alignment waveform 406. As an example of the calculation method, there is a method of setting the position of the center of gravity of the alignment waveform 406 as the mark position 402. As another example, there is a method of calculating the mark position by calculating the phase of the alignment waveform by Fourier transform or the like or a method of calculating the mark position by using a pattern matching method.

Returning the description to FIG. 1, in step S105, a curing device 107 will irradiate the imprint material IM, which is between the substrate S and the pattern region MP of the mold M, with energy for curing the imprint material IM. This will cure the imprint material IM and form a cured product of the imprint material IM. In step S106, the substrate S and the mold M are relatively driven by at least one of the substrate driving mechanism 105 and the mold driving mechanism 122 so that the cured product of the imprint material IM and the pattern region MP of the mold M will be separated from each other. In one example, the mold M is driven by the mold driving mechanism 122 so as to separate the pattern region MP of the mold M from the cured product of the imprint material IM. The pattern region MP of the mold M can be deformed in a convex shape toward the substrate S also when the cured product of the imprint material IM and the pattern region MP of the mold M are to be separated from each other. In addition, the image capturing device 112 will execute image capturing, and the state of separation between the imprint material IM and the mold M can be observed based on the captured image.

In step S107, the controller 110 determines whether the processes of the imprint process from step S102 to step S106 have been performed on all of the shot regions of the substrate S. If it is determined that the processes of the imprint process from step S102 to step S106 have been performed on all of the shot regions of the substrate S, the controller 110 will advance the process to step S108. If it is determined that an unprocessed shot region is present, the process returns to step S102. In this case, the processes of the imprint process from step S102 to step S106 are executed on a shot region selected from the unprocessed shot regions.

In step S108, the substrate conveyance system (not shown) will convey the substrate S from the substrate holder 102 to a conveyance destination (for example, a relay portion to a post-processing apparatus). In a case in which a lot formed by a plurality of substrates is to be processed, the operation shown in FIG. 1 will be executed on each of the plurality of substrates.

Figure 4:
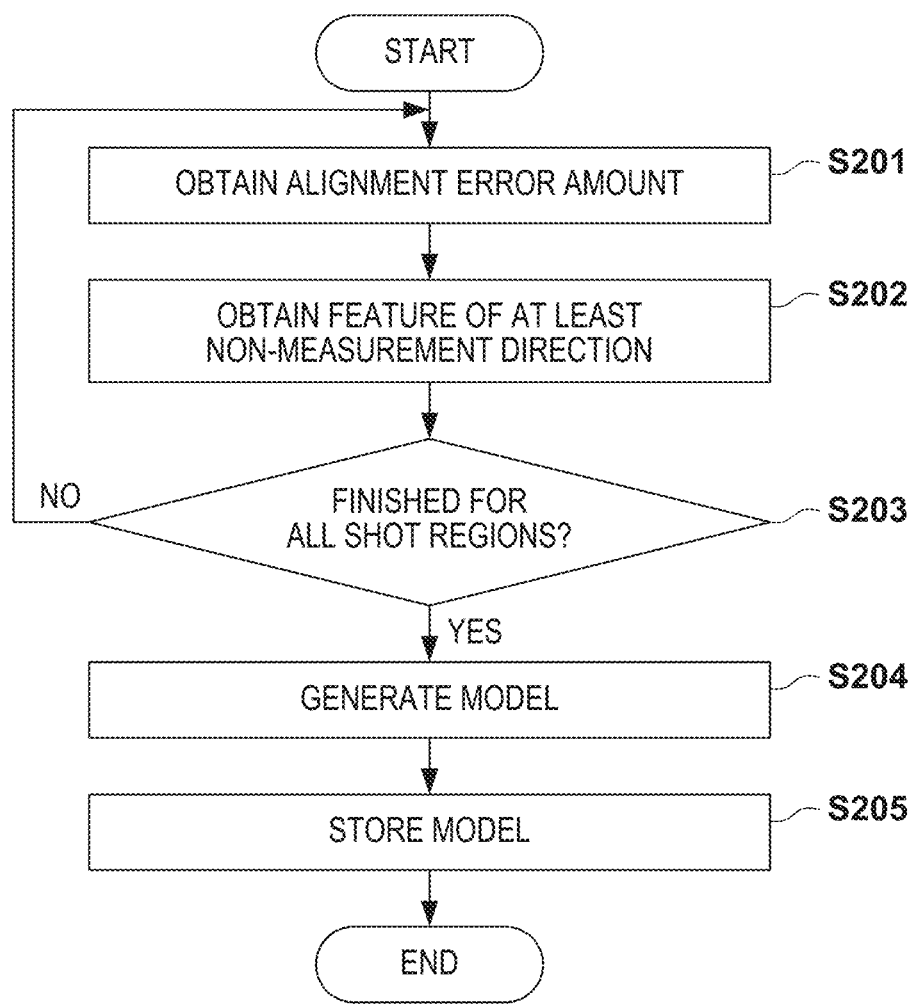
FIG. 4 is a flowchart showing an example of a method for determining a model for calculating an alignment error amount (correction value)

The model generation method of the model generation apparatus 1007 will be described next with reference to FIG. 4. Note that the model generation apparatus 1007 may be incorporated in the imprint apparatus IMP (for example, the controller 110) as described above, and model generation will be performed in the imprint apparatus IMP in such a case.

In step S201, first, the model generation apparatus 1007 will obtain a measurement value of one shot region of the substrate S measured by an overlay inspection apparatus. The measurement value to be obtained can be a result obtained by measuring the overlay accuracy of at least one point belonging to each shot region of the substrate S. The measurement value can be, for example, an overlay shift amount obtained between (an overlay inspection mark of) an underlying layer of the substrate S and (an overlay inspection mark of) of a layer formed above this underlying layer by the imprint apparatus IMP. In step S201, the model generation apparatus 1007 will calculate, as the alignment error amount, a difference between the measurement value obtained by the overlay inspection apparatus and the measurement value (for example, the alignment error ultimately obtained in step S104) obtained by the imprint apparatus IMP.

In step S202, the model generation apparatus 1007 will first obtain a mark image (image data) of the mark of the shot region from which the measurement value was obtained in the immediately preceding step S201. This mark image is a mark image obtained by using the alignment scope 106 in step S104, and is provided from the imprint apparatus IMP to the model generation apparatus 1007 at an arbitrary timing after the completion of step S104. In step S202, the model generation apparatus 1007 further obtains a feature quantity of the obtained mark image. This feature quantity includes at least a feature quantity related to the non-measurement direction, and may additionally include a feature quantity related to the measurement direction. The measurement direction is the X direction in FIGS. 6A and 6B. The non-measurement direction is a direction perpendicular to the X direction and is, for example, the Y direction in FIGS. 6A and 6B.

In step S203, the model generation apparatus 1007 determines whether the processes of steps S201 and S202 were executed for all of the plurality of shot regions considered to be targets of the substrate S. If a shot region that has not undergone the processes is present, the processes of steps S201 and S202 are performed on this shot region. Subsequently, when the processes of steps S201 and S202 have been executed on all of the plurality of shot regions considered to be targets of the substrate S, the model generation apparatus 1007 will generate, in step S204, a model for estimating an alignment error amount based on the feature quantity.

Depending on the cause of the positional shift between the measurement value obtained by the overlay inspection apparatus and the measurement value obtained by the imprint apparatus IMP, it may be possible to reduce the alignment error amount more by generating a model by using a feature quantity related to the non-measurement direction and a feature quantity related to the measurement direction. In such a case, it is preferable to generate a model that has been trained by using both the feature quantity related to the non-measurement direction and the feature quantity related to the measurement direction.

Model generation can be performed by, for example, machine learning. A more specific example can be raised as follows. First, a new layer (pattern) is formed on each of a plurality of shot regions under the same condition by the imprint apparatus IMP. Next, an external overlay inspection apparatus measures an overlay shift amount between (an overlay inspection mark of) an underlying layer and (an overlay inspection apparatus of) a newly formed layer of each shot region. Subsequently, the model generation apparatus 1007 obtains the measured overlay shift amount of each shot region and calculates, as the alignment error amount, the difference between the overlay shift amount of each shot region and the measurement value obtained when a layer was newly formed on the shot region. Thereafter, the model generation apparatus 1007 will perform machine learning by using, as input data of the model, the feature quantity of the mark image of each shot region used when newly forming layer, and using the calculated alignment error amount as the supervised data. At this time, if an abnormal value is present in the input data and/or the supervised data, it is preferable to perform machine learning by excluding this data.

Preprocessing may be performed on the alignment error amount when machine learning is to be performed. Examples of preprocessing are, for example, a method for adding an offset value to the alignment error amount and a method of changing the scale of error by multiplying the alignment error amount by a value.

For example, Gaussian process regression and Bayesian inference in which inference with consideration to uncertainty is performed by using a variable as a probability can be raised as examples of methods of machine learning. In a case in which Gaussian process regression and Bayesian inference are to be used, the model can be a function that will output a probability distribution of the alignment error amount by inputting a feature quantity, and the optimization of an internal variable can be performed by machine learning. An expected value of the obtained probability distribution of the error amount can be used as an inference value of the error amount.

In a case in which the computational complexity of the inference needs to be reduced, it is suitable to use a statistical model with a low computational complexity such as a multiple regression analysis or the like. In a case in which the alignment error amount is to be calculated by using a high dimensional feature quantity such as by setting each pixel value of a mark image as a feature quantity, it is suitable to use a method that optimizes an interval variable by using a neural network formed by a multilayer perceptron. In a case in which many abnormal values are included in the alignment error amount or the mark image, a method based on a decision tree analysis which is robust to abnormal value may be used. In a case in which a multiple regression analysis or a neural network is to be used, a model will be defined to output an alignment error amount when a feature quantity is input, and optimization of an internal variable can be performed by machine learning. In a case in which a decision tree analysis is to be used, a model will be defined to output an alignment error amount when a feature quantity is input, and a decision tree will be constructed by machine learning.

In step S205, the model generation apparatus 1007 will store the model generated in step S204. In addition, the model generation apparatus 1007 can also provide the model generated in step S204 to the controller 110 of the imprint apparatus IMP.

The reason why the alignment error amount will be inferred based on the quantity amount of a mark image in the non-measurement direction will be described here. FIG. 14D shows the principle of measuring the relative position information between the shot region of the substrate S and the mold M based on the moiré fringes as an optical image formed by the first mark provided on the shot region of the substrate S and the second mark provided on the mold M. FIG. 14D shows a first mark 3a provided on the shot region of the substrate S and a second mark 2a provided on the mold M. The alignment scope 106 includes an illumination optical system that illuminates these marks, and the illumination optical system has a pupil plane P. Reference symbols IL1, IL2, IL3, and IL4 indicate rays of illumination light from poles formed on the pupil plane P.

The illumination light IL1 and the illumination light IL2 are used for the measurement of a relative position between the shot region of the substrate S and the mold M in the X direction. As exemplified in FIG. 14A, in the measurement of the relative position in the X direction, the illumination light IL3 and the illumination light IL4 which are not used in the measurement of the relative position in the X direction can become rays of scattered light by being scattered by the edges of the first mark 3a and the second mark 2a. Each ray of scattered light can become a flare and mix into a moiré fringe signal (moiré fringe image data). FIG. 14C shows an example of a signal intensity distribution (light intensity distribution on a light receiving surface of an image capturing element of the alignment scope 106) of the moiré fringe signal in the X direction in FIG. 14A. It can be seen that there are large peaks on the left end side and the right end side of the signal intensity distribution due to the influence of the rays of light scattered by the edges of the first mark 3a and the second mark 2a. Among the four cycles of the moiré fringe signal, the two cycles on the left end side and the right end side have received the influence of the scattered light, and the measurement accuracy of the relative position is influenced as a result. A similar phenomenon also occurs in the measurement of a relative position in the Y direction, and the illumination light IL1 and the illumination light IL2 which are not used in the measurement of the relative position in the Y direction can become rays of scattered light by being scattered by the edges of a first mark 3b and a second mark 2b. As a result, each ray of scattered light can become flare light and mix into the moiré fringe signal. Although the influence of flare light on the light intensity distribution in each measurement direction has been described above, the light intensity distribution in each non-measurement direction can also change due to receiving an influence from flare light. A change in the light distribution in the non-measurement direction can also degrade the measurement accuracy of a relative position or a position in the measurement direction.

Figure 15:
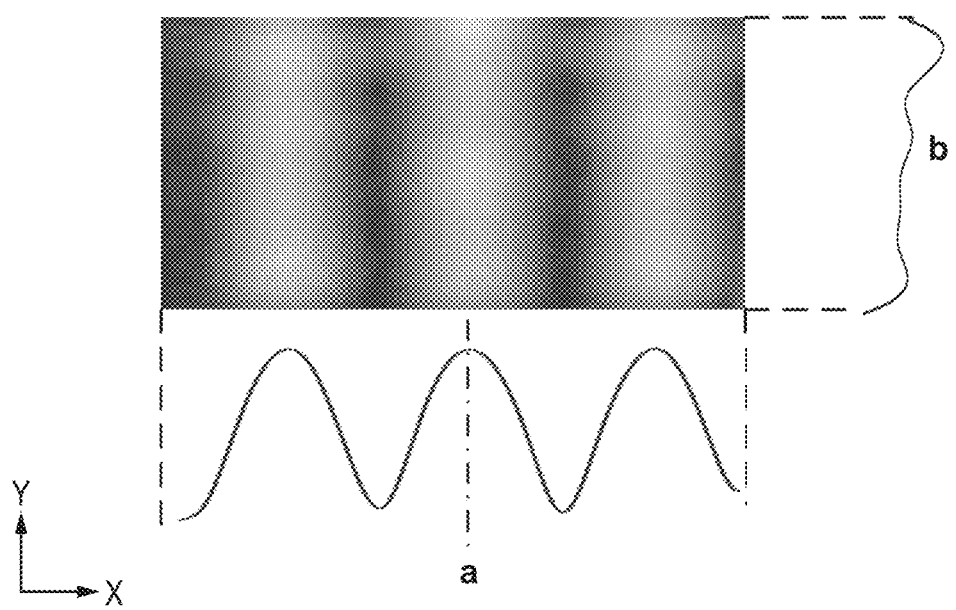
FIG. 15 is a view showing an example of waveforms in a measurement direction and a non-measurement direction of the image data of the alignment mark.
Figure 16:
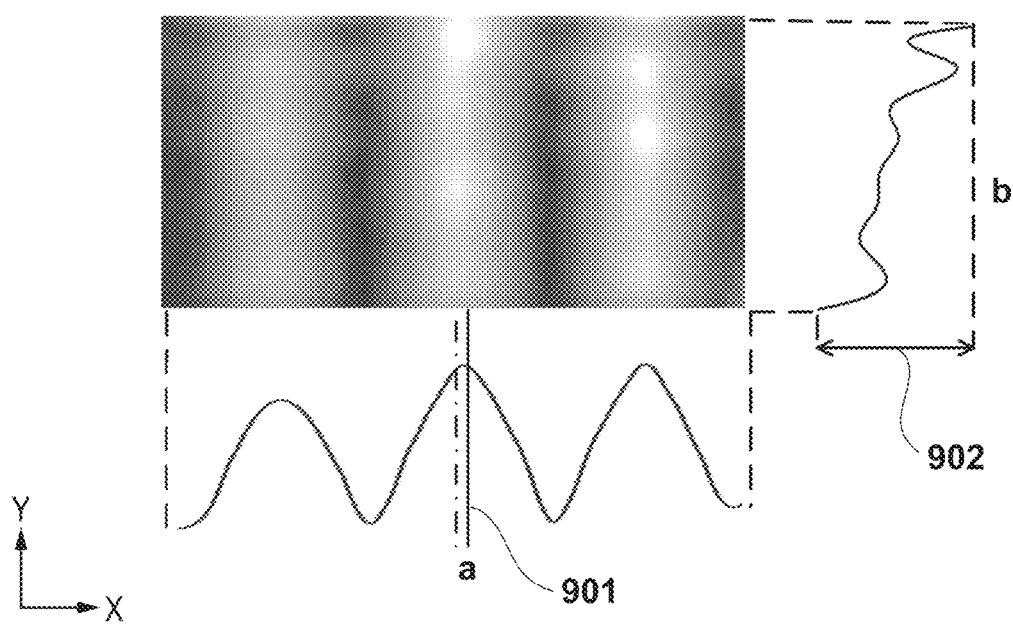
FIG. 16 is a view showing an example of the waveforms in the measurement direction and the non-measurement direction of the image data of the alignment mark.

Reference symbol (a) in FIG. 15 and reference symbol (a) in FIG. 16 each show an example of a signal waveform obtained by calculating an integrated value of signal values of pixels whose positions in the measurement direction (X direction) are equal to each other among the plurality of pixels forming the image obtained by using the alignment scope 106. Each of the signal waveforms shown in (a) of FIG. 15 and in (a) of FIG. 16 can be understood to be a signal waveform in the measurement direction. Reference symbol (b) in FIG. 15 and reference symbol (b) in FIG. 16 each show an example of a signal waveform obtained by calculating an integrated value of signal values of pixels whose positions in the non-measurement direction (Y direction) are equal to each other among the plurality of pixels forming the image obtained by using the alignment scope 106. Each of the signal waveforms shown in (b) of FIG. 15 and in (b) of FIG. 16 can be understood to be a signal waveform in the non-measurement direction. Compared to the examples of (a) and (b) of FIG. 15, the examples of (a) and (b) of FIG. 16 show a greater influence of flare light. The signal waveform in the measurement direction exemplified in (a) of FIG. 16 has a greater distortion than the signal waveform in the measurement direction exemplified in (a) of FIG. 15. This can generate an error 901 in the measurement result in the measurement direction. In addition, the signal waveform in the non-measurement direction exemplified in (b) of FIG. 16 has a greater distortion than the signal waveform in the non-measurement direction exemplified in (b) of FIG. 15. This indicates that there is greater variation in the signal value. In other words, it can be seen that the signal waveform in the non-measurement direction is correlated to the signal waveform in the measurement direction, that is, the measurement result in the measurement direction. Hence, the position information of a measurement target can be accurately determined by obtaining a feature quantity of the image data related to the non-measurement direction and correcting, based on this feature quantity, the provisional position information of the measurement target in the measurement direction which is obtained from the image data.

Figure 8:
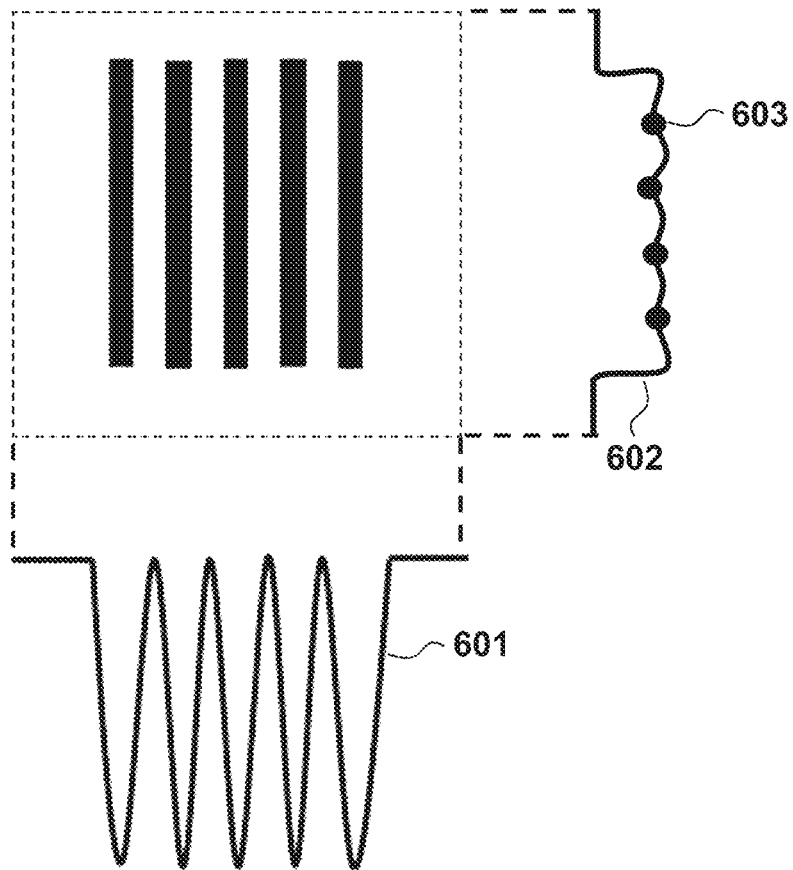
FIG. 8 is a view showing an example of a method for extracting or calculating a feature quantity related to a non-measurement direction from the image data of the alignment mark.

Here, a feature quantity obtained from the image data with respect to the non-measurement direction (second direction) can include a plurality of values 603 corresponding to a plurality of positions in the non-measurement direction as exemplified in FIG. 8. The plurality of values 603 include a plurality of integrated values, and each of the plurality of integrated values can be an integrated value of signal values of pixels whose positions in the non-measurement direction are equal to each other, among the plurality of pixels forming the image data. Alternatively, the plurality of values 603 can include the signal values of a plurality of pixels on a line parallel to the non-measurement direction, among the plurality of pixels forming the image data. Alternatively, the plurality of values 603 can be a plurality of values obtained by processing signal values of a plurality of pixels on a line parallel to the non-measurement direction, among the plurality of pixels forming the image data. Alternatively, the plurality of values 603 can be obtained by performing basis transformation on a plurality of integrated values, and each of the plurality of integrated values can be an integrated value of signal values of pixels whose positions in the non-measurement direction are equal to each other, among the plurality of pixels forming the image data. Alternatively, the plurality of values 603 can be values obtained by performing basis transformation on the signal values of a plurality of pixels which are on a line parallel to the non-measurement direction, among the plurality of pixels forming the image data. Alternatively, the plurality of values 603 can be values obtained by performing basis transformation on a plurality of values obtained by processing the signal values of a plurality of pixels which are on a line parallel to the non-measurement direction, among the plurality of pixels forming the image data.

Figure 9:
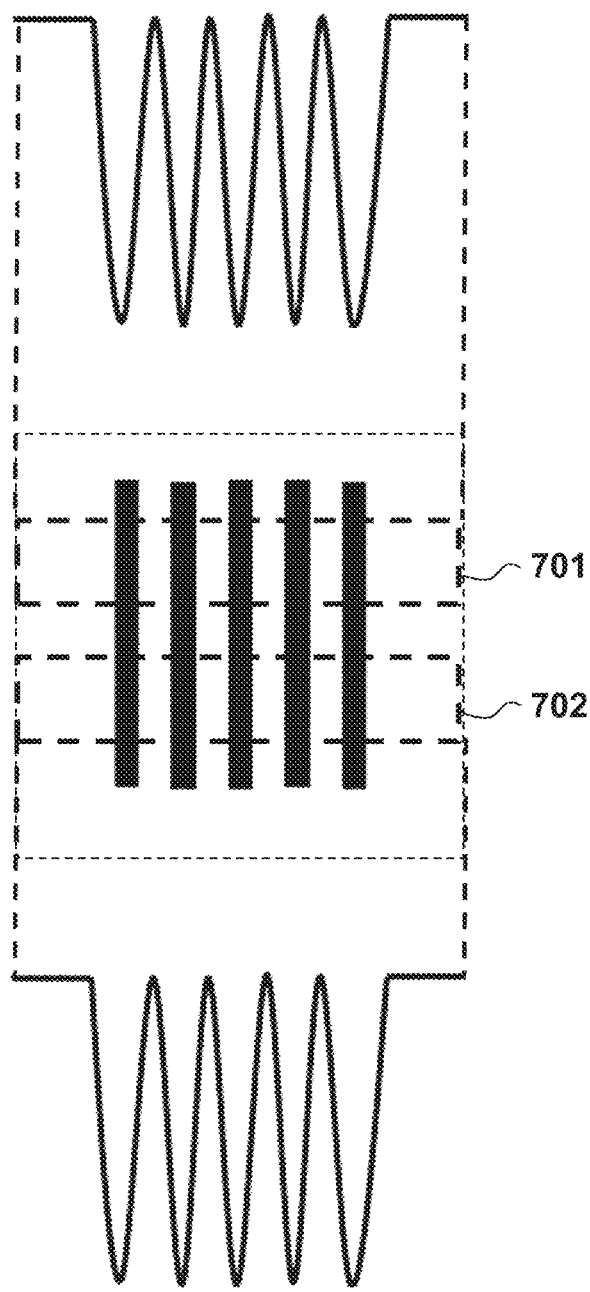
FIG. 9 is a view showing an example of the method for extracting or calculating the feature quantity related to a non-measurement direction from the image data of the alignment mark.

Alternatively, as shown in FIG. 9, a difference between a result obtained by integrating the signal values of pixels whose positions in the measurement direction are equal to each other in a region 701, and a result obtained by integrating the signal values of pixels whose positions in the measurement direction are equal to other in a region 702 may be set as a feature quantity in the non-measurement direction.

Figure 10:
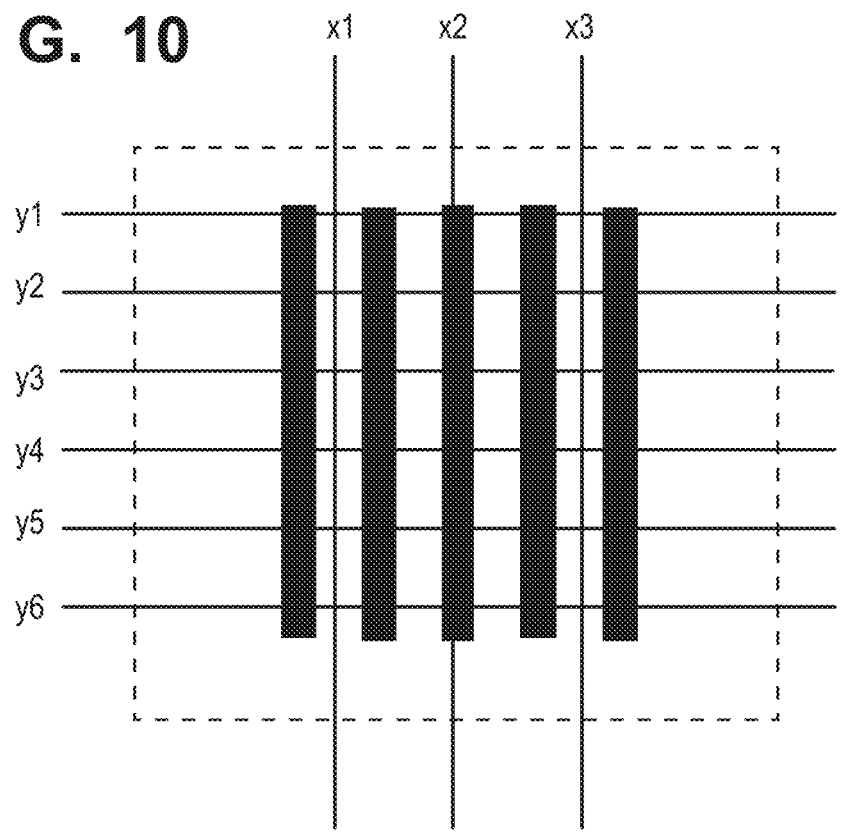
FIG. 10 is a view showing an example of the method for extracting or calculating the feature quantity related to a non-measurement direction from the image data of the alignment mark.

An example of calculating or determining a feature quantity of image data in the non-measurement direction will be described below with reference to FIG. 10. In FIG. 10, reference symbols $x1, x2, \ldots$ represent X-coordinate values (pixel positions in the X direction) of the image data of a mark obtained by image capturing by the alignment scope 106. In addition, reference symbols $y1, y2, \ldots$ represent Y-coordinate values (pixel positions in the Y-direction) of the image data. A pixel value of a pixel whose X-coordinate value is $x1$ and Y-coordinate value is $y1$ will be expressed as $x1y1$ hereinafter. The interval between and the number of the coordinates $x1, x2, \ldots$, and $y1, y2, \ldots$ of pixels to be extracted or sampled can be determined arbitrarily.

In one example, a feature of a signal waveform in the non-measurement direction can be obtained as a feature quantity by integrating the pixel values of pixels, which have y-coordinate values that are equal to each other, in the manner of $(x1y1+x2y1+x3y1+ \ldots)$, $(x1y2+x2y2+x3y2+ \ldots), \ldots$. This kind of method is effective when diffracted light and/or scattered light has been generated along the non-measurement direction.

In a case in which diffracted light or scattered light has been generated locally, $(x1y1)$, $(x1y2)$, $(x1y3)$, $(x1y4)$, $(x1y5)$, $(x1y6)$, $(x2y1)$, $(x2y2)$, $\ldots$ which are the pixel values of pixels at respective coordinate positions can be directly used as the feature quantities in the non-measurement direction. Feature quantities may also be determined here as $(x1y1+x1y2)$, $(x1y3+x1y4)$, $(x1y5+x1y6)$, $(x2y1+x2y2)$, $(x2y3+x2y4), \ldots$. By adding the pixel values of the plurality of pixels in the Y direction in this manner, it will be possible to reduce the number of data indicating the feature quantity, thus lowering the computational complexity of the calculation of the correction amount based on the feature quantities as a result. In addition, the total value of pixel values of each group formed by a plurality of pixels may be extracted as a feature quantity so as to arrange the average coordinate values of each group in an ascending order in the manner of $(x1y1+x1y3)$, $(x1y2+x1y4), \ldots$. Alternatively, the total value of pixel values of each group formed by a plurality of pixels may be extracted as a feature quantity so that coordinates of respective groups will partially overlap each other in the manner of $(x1y1+x1y2+x1y3)$, $(x1y3+x1y4+x1y5), \ldots$. Alternatively, feature quantities may be extracted by performing addition in the X and Y directions in the manner of $(x1y1+x1y2+x2y1+x2y2)$, $(x1y2+x1y3+x2y2+x2y3)$, $(x1y3+x1y4+x2y3+x2y4) \ldots$. In a case in which diffracted light and/or scattered light has been generated along a diagonal direction, feature quantities may be extracted by performing addition in the diagonal direction in the manner of $(x1y1+x2y2)$, $(x2y2+x3y3)$, $(x1y2+x2y3)$, $(x2y3+x3y4), \ldots$.

Alternatively, the pixel values of respective pixels may be multiplied by constants $\alpha, \beta, \gamma, \ldots$ in the manner of $(\alpha \times x1y1)$, $(\beta \times x1y2)$, $(\gamma \times x1y3) \ldots$. This will arbitrarily reduce the weight of each feature quantity with a small correction effect. Alternatively, feature quantities may be determined in the manner of $(\alpha \times x1y1+\beta \times x1y2+\gamma \times x1y3)$, $(a \times x1y2+b \times x1y3+c \times x1y4)$, $(p \times x1y3+q \times x1y4+r \times x1y5), \ldots$. Here, $\alpha, \beta, \gamma, a, b, c, p, q$, and $r$ each are a constant for multiplying a pixel value. Letting $\alpha=a=p=-1$, $\beta=b=p=2$, and $\gamma=C=r=-1$, it will be possible to obtain each gradient in the non-measurement direction as a feature quantity.

A new feature quantity may be obtained by performing basis transformation on a feature quantity obtained in the non-measurement direction. As an example of basis transformation, there are a method of obtaining a phase and an amplitude by performing Fourier transform and a method of contracting an information amount by obtaining a basis based on principal component analysis and performing basis transformation. A new feature quantity may also be obtained by adding an offset value to a feature quantity or by multiplying a feature quantity by an offset value. A correction value may be determined by using, in addition to a feature quantity in the non-measurement direction, a feature quantity in the measurement direction. An arbitrary point of a waveform (image data) in the measurement direction may also be sampled and used as a feature quantity, and basis transformation, addition of an offset value, or multiplication by an offset value may be performed on this feature quantity in a manner similar to a feature quantity in the non-measurement direction.

The processing for obtaining a feature quantity from the image data can also be executed by the controller 110 or the like of the imprint apparatus IMP.

Figure 5:
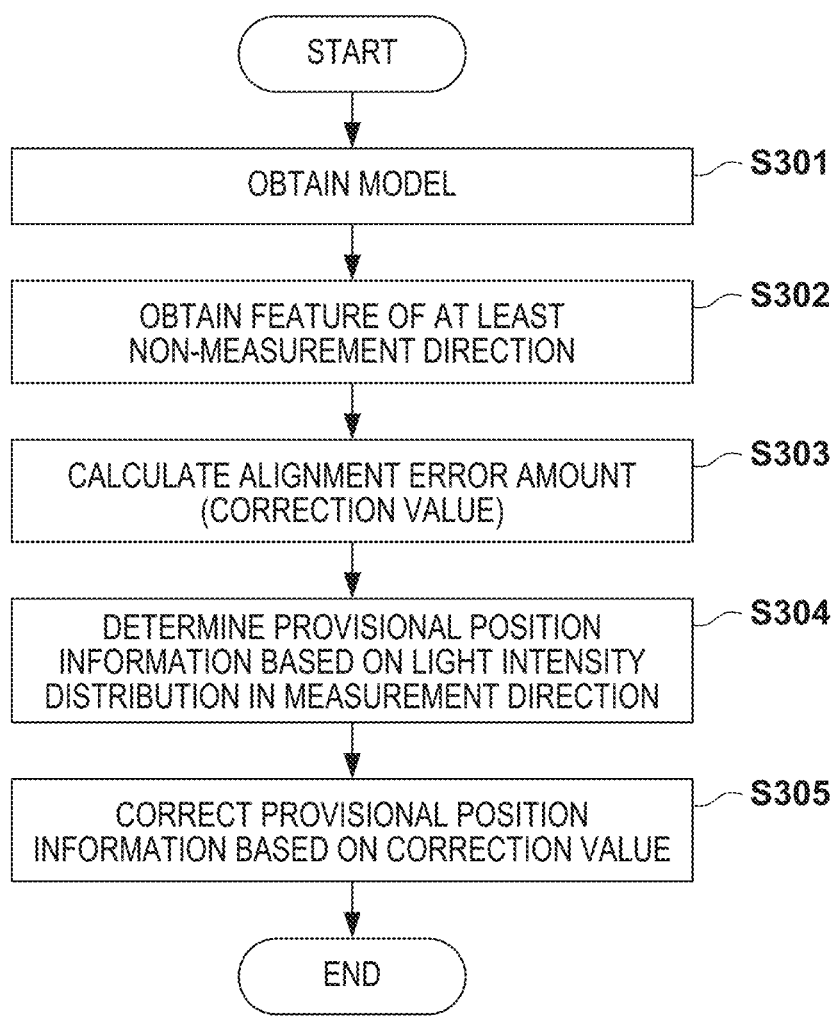
FIG. 5 is a flowchart showing an example of a method for performing correction by calculating the alignment error amount (correction value) by using the model.

Processing to be executed in the aforementioned process of step S104 (alignment) will be described below with reference to FIG. 5. In this processing, an alignment error amount will be calculated by using the aforementioned model, and the provisional position information related to the measurement direction obtained based on image data will be corrected based on this alignment error amount (correction amount).

In step S301, the controller 110 of the imprint apparatus IMP obtains a model generated by the model generation apparatus 1007. Note that a model need not be obtained immediately before the process of step S302 as a subsequent process, and may be obtained, for example, at an arbitrary timing such as a timing before the aforementioned process of step S102 or the like.

In step S302, the controller 110 obtains the image data obtained by image capturing by the alignment scope 106 in step S104, and extracts or calculates at least each feature quantity related to the non-measurement direction from the image data. The method used for calculating or extracting each feature quantity in step S302 is similar to the method for calculating or extracting each feature quantity executed by the model generation apparatus 1007 in step S202.

In step S303, the controller 110 can use the model obtained in step S301 and each feature quantity calculated or extracted in step S302 to calculate an alignment error amount. For example, if Gaussian process regression is to be used as a training means, each feature quantity will be input to the model obtained in step S301, and an expected value of a probability distribution output from the model can be obtained as an alignment error amount. This alignment error amount can be used as a correction value.

In step S304, based on a light intensity distribution related to the measurement direction of the image data obtained image capturing by the alignment scope 106 in step S104, the controller 110 obtains, as provisional position information, the position information of a measurement target in the measurement direction. This provisional position information is tentative position information which is obtained without consideration to each feature quantity related to the non-measurement direction of the image data.

In step S305, based on the provisional position information obtained in step S304 and the correction value based on each feature quantity of the image data related to the non-measurement direction obtained in step S303, the controller 110 obtains the position information of the measurement target in the measurement direction. More specifically, the controller 110 can obtain the position information of the measurement target in the measurement direction by subtracting, from the provisional position information obtained in step S304, the correction value which was obtained in step S303 and is based on each feature quantity, of the image data, related to the non-measurement direction.

In a case in which each feature quantity related to the measurement direction is to be used, in addition to each feature quantity related to the non-measurement direction, at the time of model generation, the controller 110 may calculate or extract, in step S302, each feature quantity related to the non-measurement direction and each feature quantity related to the measurement direction. Subsequently, in step S303, the controller 110 may input each feature quantity related to the non-measurement direction and each feature quantity related to the measurement direction into a model and set, as the correction value, an alignment error amount output from the model, and the controller 110 may obtain, in step S305, the position information of the measurement target.

Figure 11:
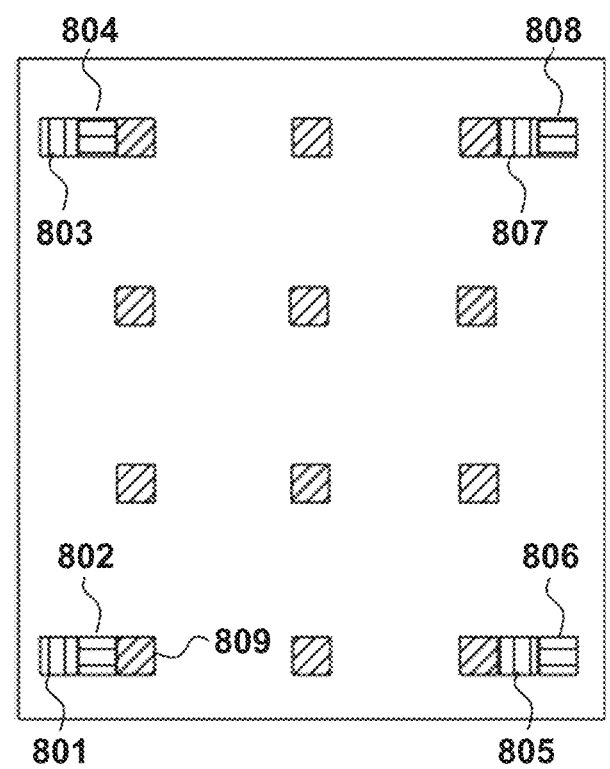
FIG. 11 is a view showing an example of the arrangement of alignment marks and overlay inspection marks.

A verification test result of the embodiment will be shown hereinafter. In this verification test, correction of alignment error amounts was performed for eight alignment marks which were alignment marks 801, 803, 805, and 807 in the X direction and alignment marks 802, 804, 806, and 808 in the Y direction in a shot region as shown in FIG. 11. Reference numeral 809 denotes each mark to be used by an overlay inspection apparatus. In this verification test, the alignment error amount of each alignment mark is calculated based on an overlay measurement result obtained from a corresponding overlay inspection mark set near the alignment mark. In the training for model generation, data of 20 wafers×69 shot regions were used, and correction was applied to 6 wafers×69 shot regions which were different from those of the data used for training. Training and correction were performed independently on the position and direction of each alignment mark.

Figure 12:
FIG. 12 is a graph showing an example of alignment error amounts of the alignment marks.

FIG. 12 represents standard deviations of the alignment error amounts of all data obtained before and after correction, and shows the degree of variation of each alignment error amount. An object of this embodiment is to minimize this variation, and it can be confirmed from this graph that the variation of each alignment error amount has decreased by a maximum of approximately 16%.

Figure 13A:
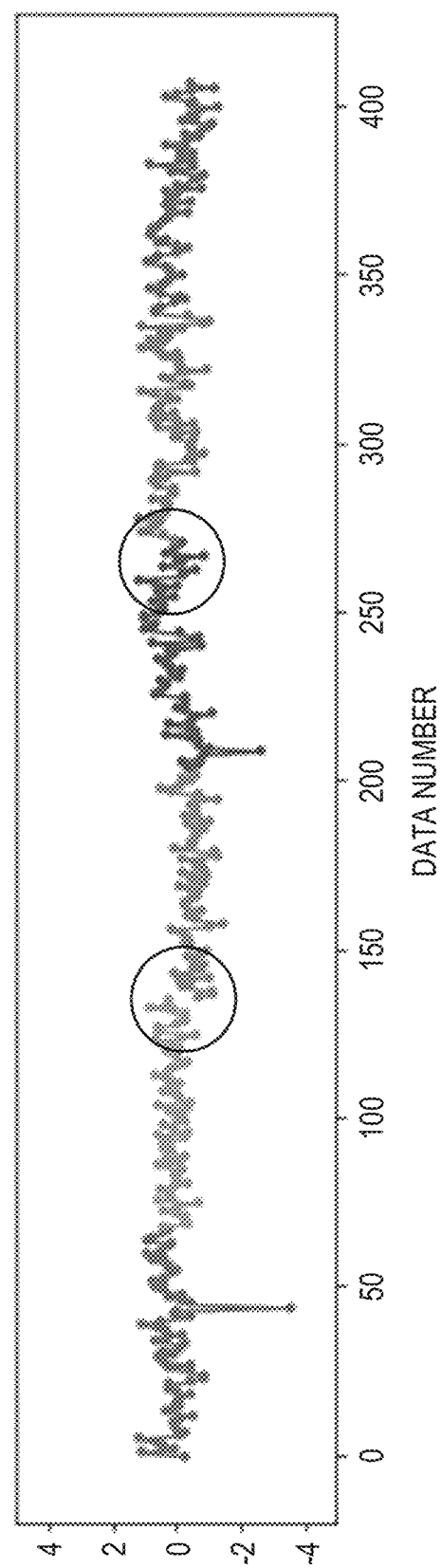
FIGS. 13A and 13B are views showing examples of the alignment error amount of the alignment mark before correction and that after correction, respectively.
Figure 13B:
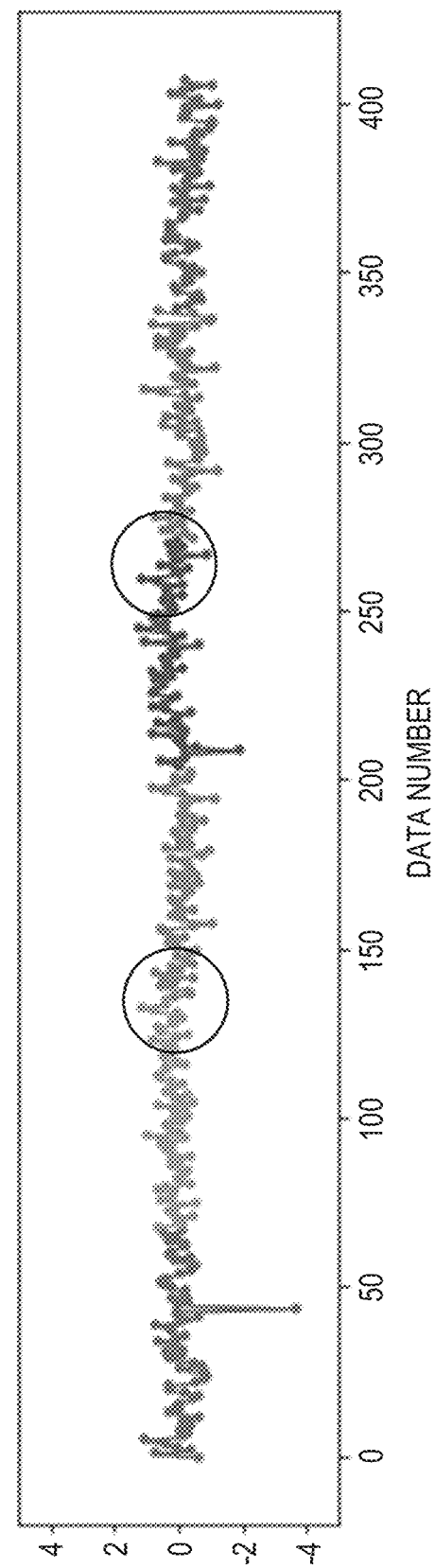

FIGS. 13A and 13B are graphs displaying the alignment error amounts before correction and after correction, respectively, of the alignment mark 804, and the alignment error amounts of respective sets of data are aligned horizontally in each graph. For example, by viewing encircled portions, it can be confirmed that variation has been reduced by the correction.

An example in which a correction value calculated from data showing the state of the imprint apparatus IMP during an imprint process is applied to an overlay inspection of a shot region of the data has been described above as an embodiment. However, the present invention is not limited to this. For example, the imprint apparatus IMP may provide a correction value to the control apparatus 1003, and this correction value may be used in subsequent processing. For example, a correction value obtained from information indicating the state of the imprint apparatus IMP during an imprint process may be applied during the alignment of another shot region such as the next shot region or the like. In addition, the correction value may also be applied during the alignment of a shot region arranged at an identical position in the next substrate.

Second Embodiment

In this embodiment, parts different from those of the first embodiment will be described, and a description of similar parts will be omitted.

In the first embodiment, in step S201, a model generation apparatus 1007 calculates, as an alignment error amount, a difference between a measurement value obtained by an overlay inspection apparatus and a measurement value (an alignment error ultimately obtained in step S104) obtained by an imprint apparatus IMP. In addition, in the first embodiment, a mark image obtained by the model generation apparatus 1007 in step S202 is an image obtained in step S104 by using an alignment scope 106 in the imprint apparatus IMP before curing of an imprint material.

In contrast, in the second embodiment, as the measurement value and the mark image of the imprint apparatus IMP, a measurement value and a mark image obtained by the alignment scope 106 in the imprint apparatus IMP between the processes of steps S105 and S106, that is, after the imprint material has been cured are used.

In addition, in the second embodiment, in step S202, a feature quantity is obtained from this mark image captured after the imprint material has been cured. This feature quantity can include at least a feature quantity related to the non-measurement direction, and may also include a feature quantity related to the measurement direction.

A substrate S which is to be measured by an external overlay inspection apparatus is in a state in which the imprint material has been cured. Hence, by using a correction value and a mark image obtained after the curing of the imprint material as the measurement value and the mark image of the imprint apparatus IMP according to the second embodiment, it will be possible to eliminate a change generated when the imprint material is cured.

Correction based on a feature quantity in the non-measurement direction may be applied not only to an imprint apparatus, but also another lithography apparatus, for example, an exposure apparatus. Alignment of a shot region of a substrate and a mold is also performed in an exposure apparatus. In this alignment, the position of each mark arranged in the shot region of the substrate can be measured, and this measurement result can be corrected by using a correction value corresponding to the feature quantity in the non-measurement direction of the image data of the mark.

A method of manufacturing an article which is a method that manufactures an article by using the above-described lithography apparatus will be described hereinafter. The method of manufacturing an article includes using the above-described lithography apparatus to perform a transfer process of transferring a pattern of an original to a substrate and a processing process of processing the substrate that has undergone the transfer process, and an article is obtained from the substrate that has undergone the processing process.

A method of manufacturing an article by using, as an example, an imprint apparatus as a lithography apparatus will be described hereinafter with reference to FIGS. 17A to 17F. The pattern of a cured product formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. The mold includes an imprint mold or the like.

The pattern of the cured product is directly used as at least some of the constituent members of the above-described articles or used temporarily as a resist mask. After etching or ion implantation is performed in the substrate processing step, the resist mask is removed.

A method of manufacturing an article in which the above-described imprint apparatus forms a pattern on a substrate, processes the substrate on which the pattern is formed, and manufactures an article from the processed substrate will be described next. As shown FIG. 17A, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 17A:
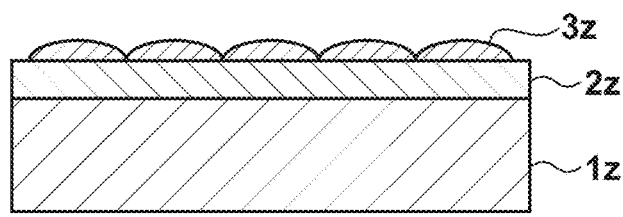
FIGS. 17A to 17F are views for explaining a method of manufacturing an article.
Figure 17B:
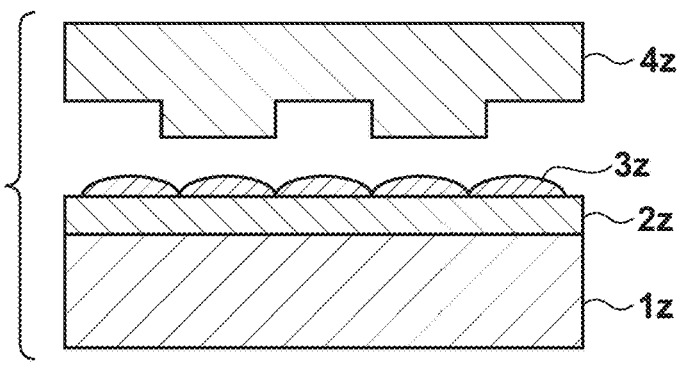
Figure 17C:
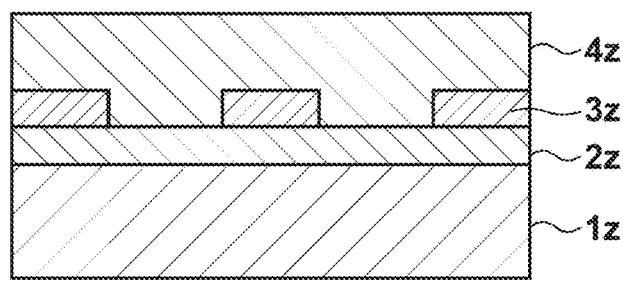

As shown in FIG. 17B, a side of a mold 4z for imprint with a concave-convex pattern is directed toward and made to face the imprint material 3z on the substrate. As shown FIG. 17C, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with light as energy for curing via the mold 4z, the imprint material 3z is cured.

Figure 17D:
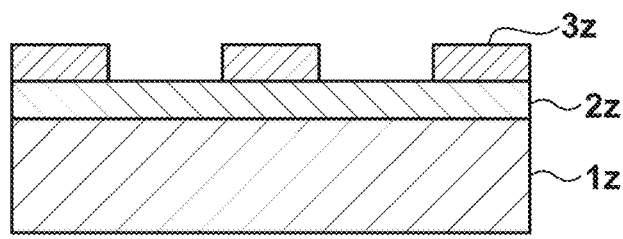

As shown in FIG. 17D, after the imprint material 3z is cured, the mold 4z is separated from the substrate 1z, and the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the concave-convex pattern of the mold 4z is transferred to the imprint material 3z.

Figure 17E:
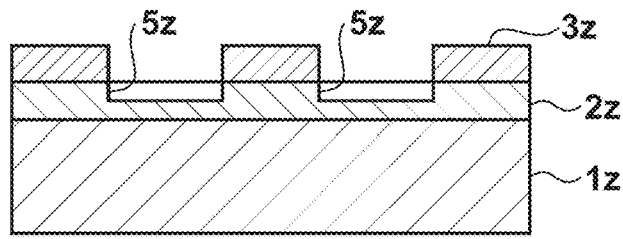
Figure 17F:
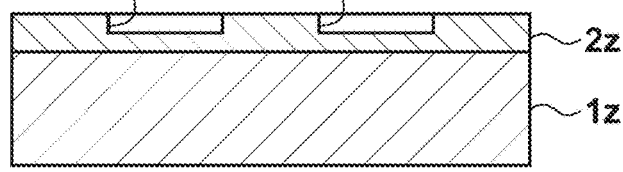

As shown in FIG. 17E, when etching is performed using the pattern of the cured product as an etching resistant mask, a portion of the surface of the processed material 2z where the cured product does not exist or remains thin is removed to form a groove 5z. As shown in FIG. 17F, when the pattern of the cured product is removed, an article with the grooves 5z formed in the surface of the processed material 2z can be obtained. Here, the pattern of the cured product is removed. However, instead of removing the pattern of the cured product after the process, it may be used as, for example, an interlayer dielectric film included in a semiconductor element or the like, that is, a constituent member of an article.

The present invention is not limited to the above embodiments and various changes and modifications can be made within the spirit and scope of the present invention. Therefore, to apprise the public of the scope of the present invention, the following claims are made.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-144875, filed Aug. 28, 2020, and Japanese Patent Application No. 2021-126044, filed Jul. 30, 2021, which are hereby incorporated by reference herein in their entirety.

What is claimed is:

1. A measurement apparatus that measures position information of a measurement target in a first direction that is to be used in an alignment process of aligning an original and a shot region of a substrate, the apparatus comprising:
a scope configured to capture an image of the measurement target and generate image data corresponding to the measurement target; and
a processor configured to obtain, based on the image data, the position information of the measurement target in the first direction,
wherein the processor is configured to determine the position information of the measurement target in the first direction based on: provisional position information of the measurement target in the first direction obtained from the image data using a correction value which is output from a model by inputting, in the model, a feature quantity, of the image data, related to a second direction different from the first direction,
wherein the processor is configured to obtain the provisional position information of the measurement target in the first direction by generating an alignment waveform by calculating, for each position in the first direction, an integrated value of signal values of pixels whose positions in the first direction are equal to each other among the plurality of pixels forming the image data, and then calculating the provisional position information based on the alignment waveform, and
wherein the processor is configured to cause the alignment process of aligning the original and the shot region of the substrate to be performed using the position information of the measurement target in the first direction determined by the processor.

2. The apparatus according to claim 1, wherein the processor is configured to obtain the correction value by inputting, in the model, a feature quantity, of the image data, related to the first direction and the feature quantity, of the image data, related to the second direction.

3. The apparatus according to claim 1, further comprising:
a model configured to obtain the correction value based on the feature quantity.

4. The apparatus according to claim 3, further comprising:
a machine learning controller configured to generate the model by machine learning.

5. The apparatus according to claim 4, wherein the machine learning controller performs machine learning by using the feature quantity as input data of the model and using, as supervised data, a difference between position information of the measurement target measured by an external inspection apparatus and the position information determined by the processor.

6. The apparatus according to claim 4, wherein the machine learning is performed by using at least one of Gaussian process regression, Bayesian inference, a multi-layer perceptron, a multiple regression analysis, and a decision tree.

7. The apparatus according to claim 1, wherein the second direction is a direction perpendicular to the first direction.

8. The apparatus according to claim 1, wherein the feature quantity obtained from the image data in relation to the second direction includes a plurality of values corresponding to a plurality of positions in the second direction.

9. The apparatus according to claim 8, wherein the plurality of values include a plurality of integrated values, and each of the plurality of integrated values is an integrated value of signal values of pixels whose positions in the second direction are equal to each other, among a plurality of pixels that form the image data.

10. The apparatus according to claim 8, wherein the plurality of values include signal values of a plurality of pixels on a line parallel to the second direction, among a plurality of pixels that form the image data.

11. The apparatus according to claim 8, wherein the plurality of values are obtained by processing signal values of a plurality of pixels on a line parallel to the second direction, among a plurality of pixels that form the image data.

12. The apparatus according to claim 8, wherein the plurality of values are obtained by performing basis transformation on a plurality of integrated values, and each of the plurality of integrated values is an integrated value of signal values of pixels whose positions in the second direction are equal to each other, among a plurality of pixels that form the image data.

13. The apparatus according to claim 8, wherein the plurality of values are obtained by performing basis transformation on signal values of a plurality of pixels on a line parallel to the second direction, among a plurality of pixels that form the image data.

14. The apparatus according to claim 8, wherein the plurality of values are obtained by performing basis transformation on a plurality of values obtained by processing signal values of a plurality of pixels on a line parallel to the second direction, among a plurality of pixels that form the image data.

15. The apparatus according to claim 13, wherein the basis transformation is performed by using at least one of Fourier transform and a principal component analysis.

16. The apparatus according to claim 1, wherein the correction value is obtained based on, in addition to the feature quantity, of the image data, related to the second direction, a feature quantity, of the image data, related to the first direction.

17. The apparatus according to claim 1, wherein the measurement target is a mark.

18. The apparatus according to claim 1, wherein the measurement target is moiré fringes formed by a first mark of a first member and a second mark of a second member, and the position information is relative position information between the first mark and the second mark.

19. A lithography apparatus that transfers a pattern of an original to a substrate, comprising:
   a measurement apparatus defined in claim 1 and configured to measure a relative position between a shot region of the substrate and the original,
   wherein the lithography apparatus is configured to execute alignment of the shot region and the original based on an output of the measurement apparatus.

20. A method of manufacturing an article, comprising:
   transferring a pattern of an original to a substrate by using a lithography apparatus defined in claim 19; and
   processing the substrate that has undergone the transferring,
   wherein the article is obtained from the substrate that has undergone the processing.

21. The apparatus according to claim 1, wherein the processor is configured to extract or calculate the feature quantity related to the second direction from the image data, and to obtain the correction value by inputting, in the model, the feature quantity related to the second direction.

22. A measurement method of measuring position information of a measurement target in a first direction that is to be used in an alignment process of aligning an original and a shot region of a substrate, the method comprising:
   generating image data corresponding to the measurement target by capturing an image of the measurement target using a scope; and
   executing processing to obtain the position information of the measurement target in the first direction based on the image data,
   wherein the executing the processing includes determining the position information of the measurement target in the first direction based on: provisional position information of the measurement target in the first direction obtained from the image data using a correction value which is output from a model by inputting, in the model, a feature quantity, of the image data, related to a second direction different from the first direction,
   wherein the executing the processing includes obtaining the provisional position information of the measurement target in the first direction by generating an alignment waveform by calculating, for each position in the first direction, an integrated value of signal values of pixels whose positions in the first direction are equal to each other among the plurality of pixels forming the image data, and
   wherein the alignment process of aligning the original and the shot region of the substrate is performed using the determined position information of the measurement target in the first direction.

23. The method according to claim 22, wherein the executing the processing includes extracting or calculating the feature quantity related to the second direction from the image data, and obtaining the correction value by inputting, in the model, the feature quantity related to the second direction.

24. A measurement apparatus that measures position information of a measurement target in a first direction that is to be used in an alignment process of aligning an original and a shot region of a substrate, comprising:
   a scope configured to capture an image of the measurement target and generate image data corresponding to the measurement target; and
   a processor configured to obtain, based on the image data, the position information of the measurement target in the first direction,
   wherein the processor is configured to determine the position information of the measurement target in the first direction based on: provisional position information of the measurement target in the first direction obtained from the image data using a correction value which is output from a model by inputting, in the model, a feature quantity, of the image data, related to a second direction different from the first direction,
   wherein the processor is configured to obtain the provisional position information of the measurement target in the first direction from a signal waveform in the first direction obtained from the image data, and
   wherein the processor is configured to obtain the feature quantity from a signal waveform in the second direction obtained from the image data, the signal waveform in the second direction being correlated to the signal waveform in the first direction, andp1 wherein the processor is configured to cause the alignment process of aligning the original and the shot region of the substrate to be performed using the position information of the measurement target in the first direction determined by the processor.

25. A measurement method of measuring position information of a measurement target in a first direction that is to be used in an alignment process of aligning an original and a shot region of a substrate, comprising:
   generating image data corresponding to the measurement target by capturing an image of the measurement target using a scope; and
   executing processing to obtain the position information of the measurement target in the first direction based on the image data,
   wherein the executing the processing includes determining the position information of the measurement target in the first direction based on: provisional position information of the measurement target in the first direction obtained from the image data using a correction value which is output from a model by inputting, in the model, a feature quantity, of the image data, related to a second direction different from the first direction,
   wherein the executing the processing includes obtaining the provisional position information of the measurement target in the first direction from a signal waveform in the first direction obtained from the image data, and obtaining the feature quantity from a signal waveform in the second direction obtained from the image data, the signal waveform in the second direction being correlated to the signal waveform in the first direction, and
   wherein the alignment process of aligning the original and the shot region of the substrate is performed using the determined position information of the measurement target in the first direction.

* * * * *